United States Patent
Canella

[19]

[11] Patent Number: 5,937,270
[45] Date of Patent: Aug. 10, 1999

[54] METHOD OF EFFICIENTLY LASER MARKING SINGULATED SEMICONDUCTOR DEVICES

[75] Inventor: Robert L. Canella, Meridian, Id.

[73] Assignee: Micron Electronics, Inc., Nampa, Id.

[21] Appl. No.: 08/590,919

[22] Filed: Jan. 24, 1996

[51] Int. Cl.$^6$ .................................................. M01L 21/66
[52] U.S. Cl. ........................................... 438/14; 219/121.8
[58] Field of Search ................................ 437/8, 209, 925; 414/935, 936, 947; 219/121.6, 121.67, 121.68, 121.72, 121.73, 121.77, 121.82, 121.83; 235/385, 375; 438/8, 9, 15, 17; 101/44, 35

[56] References Cited

U.S. PATENT DOCUMENTS

| | | | |
|---|---|---|---|
| 4,058,217 | 11/1977 | Vaughan et al. | 209/74 M |
| 4,095,095 | 6/1978 | Muroaka et al. | 235/375 |
| 4,323,755 | 4/1982 | Nierenberg . | |
| 4,370,542 | 1/1983 | Mills et al. . | |
| 4,375,025 | 2/1983 | Carlson . | |
| 4,510,673 | 4/1985 | Shills et al. | 29/574 |
| 4,610,359 | 9/1986 | Muller | 235/385 |
| 4,638,144 | 1/1987 | Latta, Jr. . | |
| 4,791,267 | 12/1988 | Yokoyama et al. . | |
| 4,818,835 | 4/1989 | Kuwabara et al. | 219/121.6 |
| 4,914,269 | 4/1990 | Kinsman et al. . | |
| 4,916,293 | 4/1990 | Cartlidge et al. | 235/375 |
| 4,965,829 | 10/1990 | Lemelson . | |
| 5,043,657 | 8/1991 | Amazeen et al. | 324/158 R |
| 5,117,963 | 6/1992 | Thayer et al. . | |
| 5,177,368 | 1/1993 | Kay | 235/385 |
| 5,204,987 | 4/1993 | Klingel | 219/121.77 |
| 5,219,765 | 6/1993 | Yoshida et al. | 438/17 |
| 5,226,361 | 7/1993 | Grant et al. . | |
| 5,245,166 | 9/1993 | Shepard | 235/385 |
| 5,256,578 | 10/1993 | Corley et al. | 437/8 |
| 5,260,542 | 11/1993 | Ishiguro et al. | 219/121.68 |
| 5,279,975 | 1/1994 | Devereaux et al. | 438/18 |
| 5,302,798 | 4/1994 | Inagawa et al. | 219/121.77 |
| 5,307,010 | 4/1994 | Chui | 438/18 |
| 5,315,094 | 5/1994 | Lisy | 235/385 |
| 5,357,077 | 10/1994 | Tsuruta . | |
| 5,360,747 | 11/1994 | Larson et al. | 437/8 |
| 5,375,320 | 12/1994 | Kinsman et al. . | |
| 5,399,828 | 3/1995 | Riddle et al. | 219/121.77 |
| 5,498,851 | 3/1996 | Hayashi et al. | 219/121.77 |
| 5,587,094 | 12/1996 | Yoshida et al. | 219/121.68 |
| 5,605,641 | 2/1997 | Chiba et al. | 219/121.68 |
| 5,629,484 | 5/1997 | Liska | 219/121.68 |
| 5,632,083 | 5/1997 | Tada et al. | 219/121.68 |
| 5,632,915 | 5/1997 | Schnetzer et al. | 219/121.82 |
| 5,654,204 | 8/1997 | Anderson | 438/15 |
| 5,665,609 | 9/1997 | Mori | 438/17 |
| 5,719,372 | 2/1998 | Togari et al. | 219/121.6 |
| 5,808,268 | 9/1998 | Balz et al. | 219/121.8 |
| 5,821,497 | 10/1998 | Yamazaki et al. | 219/121.69 |

FOREIGN PATENT DOCUMENTS 2-205281  8/1990  Japan ..................... 235/385

*Primary Examiner*—John F. Niebling
*Assistant Examiner*—Michael S. Lebentritt
*Attorney, Agent, or Firm*—Trask, Britt & Rossa

[57] ABSTRACT

A laser marking apparatus and method for marking the surface of a singulated article such as a semiconductor chip are described herein. Semiconductor chips are fed along inclined, parallel tracks to a laser marking field where they are subsequently marked by a laser beam. As the laser beam is marking chips associated with one track, chips associated with other tracks that have already been marked are replaced by unmarked chips. In this manner, the laser is continually being used to mark semiconductor chips without having to wait for unmarked chips to move to the marking location.

15 Claims, 7 Drawing Sheets

METHOD OF EFFICIENTLY LASER MARKING SINGULATED SEMICONDUCTOR DEVICES

BACKGROUND OF THE INVENTION

1. Field of the Invention

This invention relates generally to a laser marking technique and, more specifically, to an apparatus and method for efficiently marking the surface of a singulated article such as a packaged semiconductor device using a laser, wherein the laser is substantially continually in use.

2. State of the Art

As the production rates of semiconductor devices (frequently referred to as "chips"), including packaged die, have increased, manufacturers of chips have searched for ways to quickly and efficiently mark their product. Typically, finished semiconductor devices are marked with the company name, a part or serial number, or other information such as lot number. As production rates continue to increase, however, current marking techniques may not efficiently meet the demand.

Typical conventional marking methods utilize a mechanical ink transferring device to stamp each individual semiconductor device or, at best, a pair of devices. Such an ink stamping apparatus is capable of marking approximately 2,500 semiconductor devices per hour or, if paired for marking, 5,000 per hour. These figures, while impressive, still present a significant bottleneck in the production cycle. In addition, ink stamping methods add an inherent lag time to the production cycle before product is shipped because of additional set-up time to achieve a good quality mark and additional cure time associated with ink drying. Moreover, mold release materials (such as carnuba wax or silicon) may cause the ink to not adhere to the plastic or ceramic package.

Manufacturing processes using such an ink stamping method generally include the ink stamping step just after post-encapsulation processing (if the package is to be marked) to allow for an extended (48 hour) drying or cure time without affecting the production rate. Such early marking may result, however, in the marking of chips which are later proven defective in a post-encapsulation burn-in cycle. Even if chips are ink-stamped at the end of the production cycle, curing (even if by UV rather than heat-induced) is necessary as a last step.

Another problem associated with ink stamping methods is that the quality (definition, consistency) of ink stamped marks may vary substantially over time. This variation may be dependent upon the pressure (force) applied by the stamp, the quantity of ink applied, variations in ink pigment and carrier (solvent) content, ambient temperature and humidity, and/or the condition (wear, ink residue) of the surface of the stamp. In any event, the character of a stamped mark may vary widely from chip to chip. Moreover, volatile solvents may present ventilation problems in a cleanroom environment.

As a result of the deficiencies associated with ink stamping, it has become increasingly popular to use a laser beam to mark the surface of a chip package. Unlike ink stamping, laser marking is fast, requires no curing time, and produces a consistently high-quality mark with minimal set-up time. In laser marking apparatuses, the laser beam basically burns a mark into the surface of the article of manufacture to produce a permanent mark, in contrast to inked marks, which may smear, degrade, fade or wear off. In the case of a packaged chip, the laser marking creates a different reflectivity from the rest of the package surface. Thus, by holding the chip at an angle to a light source, the information inscribed on the chip by the laser can easily be read.

Various machines and methods have been developed for marking a chip or other article of manufacture with a laser. As illustrated in U.S. Pat. No. 5,357,077 to Tsuruta, a plurality of semiconductor devices is placed in a tubular holder and transported by a coextensive group of conveyor belts to a laser for marking. Similarly, in U.S. Pat. No. 4,638,144 to Latta, Jr., electronic parts in the form of strips of lead frame supported components are conveyed to a laser marking station in magazines, unloaded, laser marked, and then reloaded into magazines. Likewise in U.S. Pat. No. 4,375,025 to Carlson, a strip of electronic components is conveyed by drive wheels to and from a position where a laser beam inscribes various characters or other information on the component surfaces. None of the above-mentioned references, however, disclose conveying articles of manufacture along multiple, separate paths so that a single laser can be marking articles on one path while articles are moved into marking position along another path. Thus, the lasers in the above-mentioned documents are inactive for substantial periods while awaiting articles of manufacture to be moved into the marking position.

U.S. Pat. No. 4,370,542 to Mills et al. discloses a laser marking apparatus for marking a cable. The apparatus sequentially moves laterally adjacent cables along a marking platen and selectively positions and operates a laterally translatable laser to mark a stationary cable portion while another cable portion is being moved. The device, however, is not capable of marking semiconductor devices or similar singulated articles of manufacture.

Thus, it would be advantageous to provide a marking apparatus and method thereof that efficiently utilizes the speed and accuracy of a laser to precisely and clearly mark singulated semiconductor devices. Moreover, it would be advantageous to develop a method and apparatus for marking the surface of a semiconductor device that can mark in excess of 10,000 chips per hour.

SUMMARY OF THE INVENTION

According to the present invention, a laser marking apparatus and method are disclosed wherein a singulated article such as a packaged semiconductor device (chip) is subjected to a laser beam for marking purposes. While the laser beam is actively marking a chip at one marking location, another chip is moving into position at another, adjacent marking location accessible by the same laser beam source. Once a chip has been marked, the laser source alternates to the adjacent marking location and begins marking another chip while the previously marked chip is being replaced by an unmarked chip. In this manner, the laser is substantially continually marking a chip at one or the other of the marking locations and is not waiting for chips to be positioned at a marking location.

In a particular and preferred aspect of the invention, more than one chip may be present at each marking location. That is, a plurality of chips is positioned (preferably in a row) at each marking location, and all of the chips at one marking location are marked in succession and then replaced by a like plurality of unmarked chips while the laser marks a plurality of chips at another marking location.

In another particular and preferred aspect of the invention, a single lens is positioned over a marking field including two or more locations such that chips positioned at any point within the marking field can be marked by translating the laser beam but without moving the lens. In such an arrangement, the number of marking locations within a marking field is ultimately limited by the size of the lens. This affects the quantity of chips on adjacent paths that can be reached by a laser beam passed through the lens, and the speed of the microprocessor controlling the speed (vectoring) of the laser marking. As the size of the lens increases, the quality of marking resolution may decrease, as the size of the impingement point of the laser beam increases unacceptably. As speeds of the galvanometers controlling the laser increase, the speed of marking may ultimately be limited by the speed at which chips can be positioned at and removed from a marking location. Currently, lasers can write approximately 160 characters per second (c.p.s.); however, some newer galvanometers afford operational speeds of over 200 c.p.s.

In yet another particular aspect of the invention, the chips are gravity fed from magazines onto tracks inclined at a particular angle relative to the support surface. The chips freely slide along the track when not retained by various components of the apparatus. For example, microprocessor-controlled indexing pins responsive to optical sensor signals may extend through the tracks to hold chips at a certain location (e.g., staging locations and marking locations) and then be retracted to allow one or more chips to continue through the marking apparatus. The chips may also be conveyed on conveyor belts or otherwise transported through the laser marking apparatus by methods known in the art, although such transport mechanisms are believed to be inferior in speed and in the positional control exercised over the chips being marked.

In still another particular and preferred aspect of the invention, a debris removal system may be positioned to remove debris generated from the marking process from the marked surface of the chip. The debris removal system may include a sweep and/or vacuum device, and will generally be located immediately downstream of the laser in as close proximity as possible to the marking field, to keep as much debris as possible away from the laser-associated lens. Further, each mark will be clear of debris before any inspection of the mark occurs, and an inspection camera or other device as subsequently discussed herein will remain contaminant-free.

In another more particular aspect of the invention, the laser marking apparatus is computer (microprocessor) controlled. In addition to controlling operation and movement of the laser beam, chip movement, and other process parameters, a microprocessor may control the quality of markings. If so, the marked chips may be subjected to inspection by a camera, which sends an image of each chip to the inspection control microprocessor. That microprocessor compares the pixels of the captured image to a given resolution standard. If the marking is of a sufficiently high quality, the chips are automatically accepted. If not, the chips are automatically rejected for reprocessing.

DETAILED DESCRIPTION OF THE PREFERRED EMBODIMENT

Figure 1:
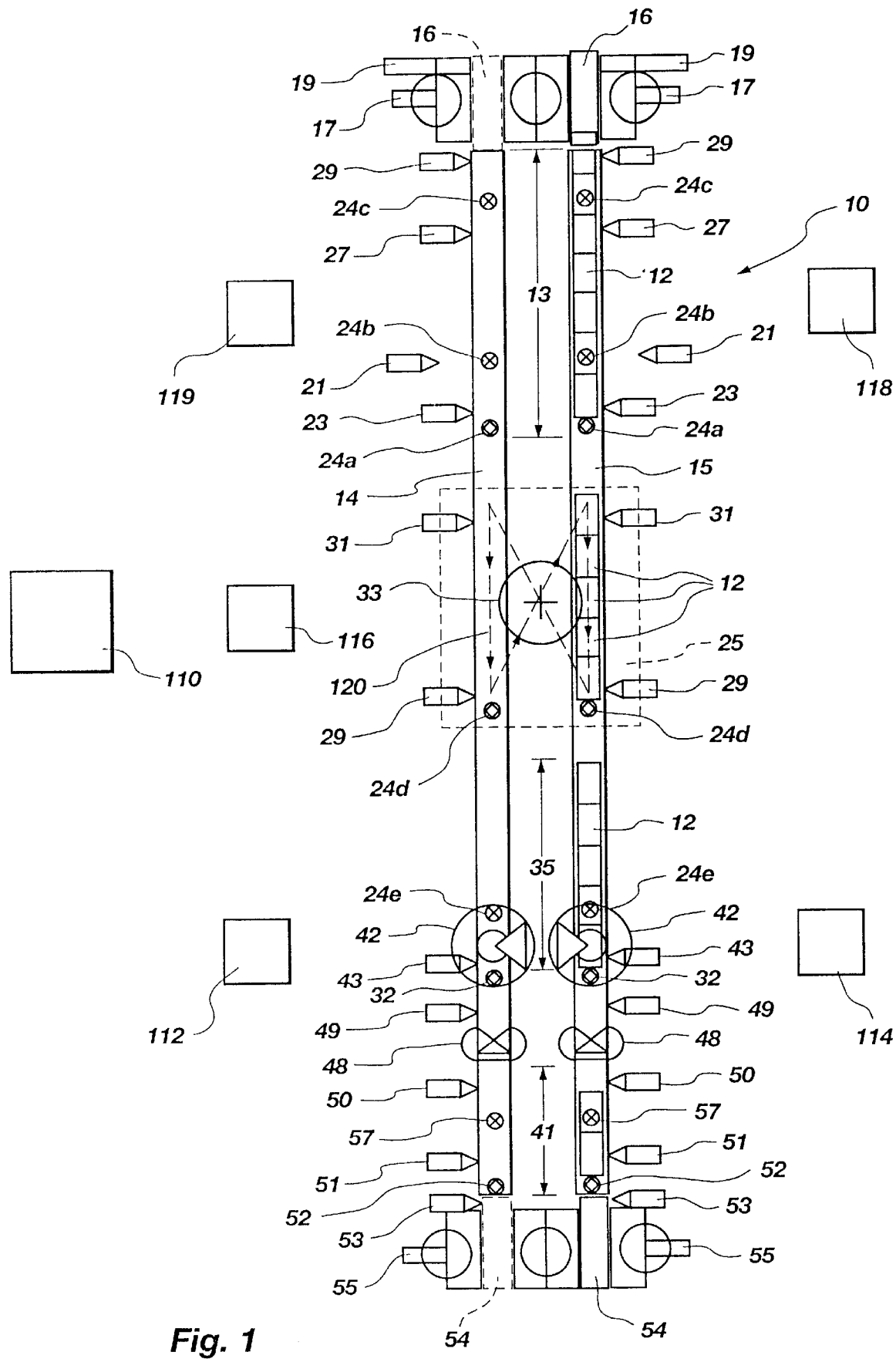
FIG. 1 is a schematic top elevation of a laser marking apparatus, perpendicular to the plane of the chip transport mechanism (which is inclined to the horizontal) in accordance with the present invention.

Referring to FIG. 1, a laser marking apparatus 10 in accordance with the present invention is illustrated. The laser marking apparatus is shown with a left track 14 and a right track 15, but may include more than two tracks, such as a third track disposed between, and parallel to, tracks 14 and 15. The left track 14 and the right track 15 are substantially similar, thus reference to elements associated with one track will apply to the other unless otherwise stated. Generally, the chips 12 are automatically fed through the laser marking apparatus 10 for marking purposes. The term "chips" as used herein refers to semiconductor devices including singulated packaged dice, as well as bare dice or even partial wafers (multiple dice severed as a group from a wafer), as the invention has utility in the marking of many types of semiconductor devices. Moreover, the invention has equal utility in the marking of any singulated article (the term "singulated article" as used herein refers to any individualized object). The chips 12 may be fed by a belt, chain, or pneumatic conveyor system as known in the art, gravity fed as shown in FIG. 1, or delivered by other means known in the art. Gravity feed is currently most preferred. It is preferred that tracks 14 and 15 be inclined at a minimum of about a 40° angle to the horizontal for gravity feed, and it is anticipated and contemplated as part of the invention that tracks 14 and 15 could be inclined to about a 90° angle to the horizontal for maximum feeding rates. To prevent loss of chips 12 from the tracks 14 and 15 as the angle of inclination approaches 90°, part containment techniques would be necessary. The chips 12 are supplied by a magazine or feed tube 16, which is preferably stacked under a number of like magazines 16 which are indexed vertically (relative to track orientation) by the feed indexing foot 17 as the lowermost magazine 16 is emptied. Vibrator or "thumper" 19 at the upstream end of the lowermost magazine 16 feeding to the track assists movement of chips 12 out of the magazine 16. When released from magazine 16 by a mechanical release mechanism as described above, the chips 12 slide onto the low-friction track 14.

Figure 2A:
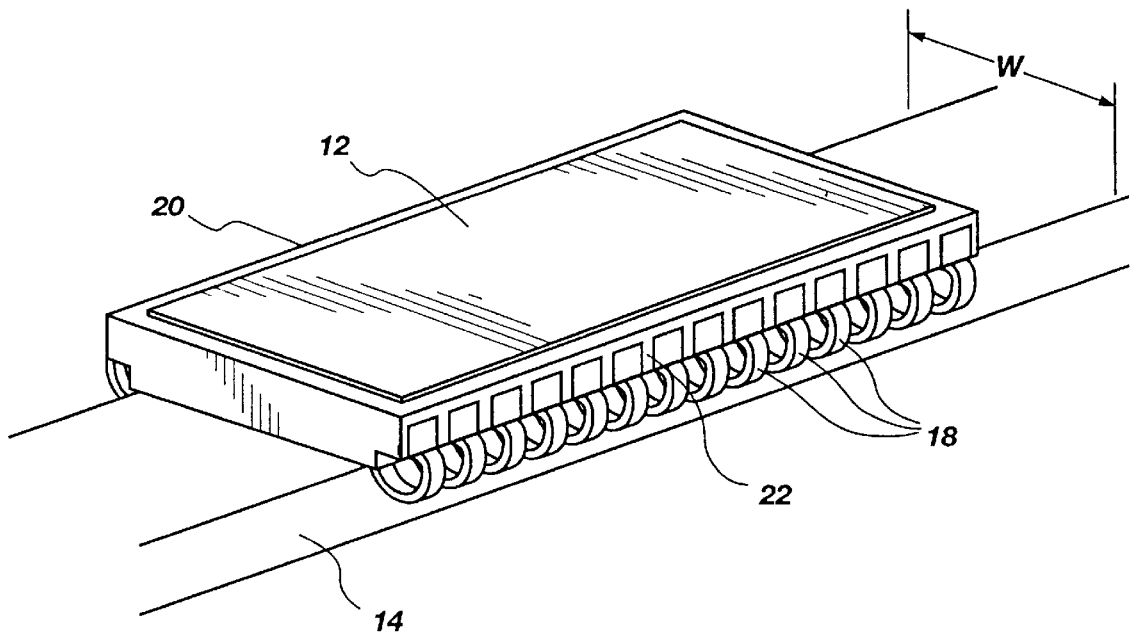
FIG. 2A is a perspective view of a packaged semiconductor device positioned on a track for conveyance to a marking location in accordance with the present invention.

As shown in FIG. 2A, typical packaged die (chips) 12 such as SOJ packages can ride directly on the track 14. The rows of outer lead ends or "J" leads 18 located along the sides 20 and 22 of the chip 12 straddle track 14 and keep the chip 12 on the track 14. Moreover, the track 14 is of a selected width W corresponding to lateral lead row spacing between the two sides of the particular chip 12 so that the chips 12 stay in lateral and rotational alignment with the track 14. Track 14 may be designed to be easily replaceable to accommodate differing lead row spacings, or snap-on inserts of the desired width may be applied to an underlying rail or track support.

Figure 2B:
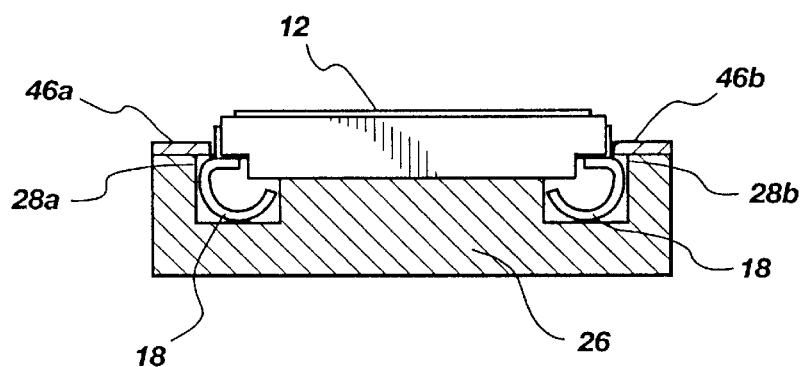
FIG. 2B is a cross-sectional view of a track with containment features for securing a semiconductor device thereto in accordance with the present invention.

A track may also actually contain the chip 12 as shown in FIG. 2B such that, in cross-section, exemplary track 26 includes troughs 28a and 28b to accommodate passage of the J leads 18. The track 26 also includes retainer members 46a and 46b to contain the J leads 18 within the troughs 28a and 28b, and thus hold chip 12 securely on the track while not inhibiting its motion thereon. In such a configuration, the track 26 may be inclined at any angle to the horizontal without having the chips 12 fall off the track 26.

As noted above, the laser marking apparatus 10 of the present invention includes a gravity feed arrangement where the track 14 is inclined with respect to the horizontal such that the force of static friction between the chips 12 and the track 14 is less than the force of gravity along the line of the track 14 on the chips 12.

When chips 12 are released from the feed magazine 16 aligned with the track 14, several chips 12 are staged, five (5) in this case by way of example, by automated indexing pins 24a, 24b and 24c at the initial staging area 13. The number of chips 12 is limited by the length of the chips being marked and the size of the laser mark field for a given beam spot size. Indexing pins 24a, 24b and 24c (and the others of apparatus 10) may be solenoid-operated for upward extension through the track surface and spring-loaded for retraction; however, dual-action air (pneumatic) cylinders with two-way positive air valve operation for extension and retraction are preferred. It is also contemplated that hydraulic indexing pin actuation may be employed, although this is less preferred. Other indexing means such as gates, fingers or other movable elements extending across the track from below, above or to the side are also contemplated as practical alternatives to pins. Optical sensor 23 senses the presence of the foremost chip 12 in a group when chips 12 are being staged upstream of pin 24a, and optical sensor 27 senses when the proper number of chips 12 has been staged as a group and is present in the staging area 13, causing pin 24c to activate and impede further movement of chips 12 into staging area 13. Pin 24b activates or deploys to prevent chip movement when the designated number of chips 12 to be marked in a given group has passed optical sensor 21.

The optical sensors employed in apparatus 10 are either light beam-interrupt type sensors or reflectivity-type sensors, with the latter being preferred. For light beam-interrupt type, the beam emitters for the sensors (such as LED's, either directly or through optical fibers), are aimed from a side of the track toward a photoreceiver across the track or under the track through an aperture in the track. Breaking of the beam indicates presence of a chip at that track location. Reflectivity-type sensors, on the other hand, are aimed at a surface of a chip and detect reflection of an emitted beam if a chip is present. Optical sensor 29 senses whether additional chips 12 are ready to be staged from magazine 16, or whether magazine 16 is to be discarded and another, vertically superimposed magazine 16 in a magazine stack is to be dropped into place responsive to feed control 17. A vibratory or "thumper" mechanism 19, as noted, may be incorporated in the feed mechanism to minimize the tendency of chips 12 to hang up within magazines 16.

Figure 3:
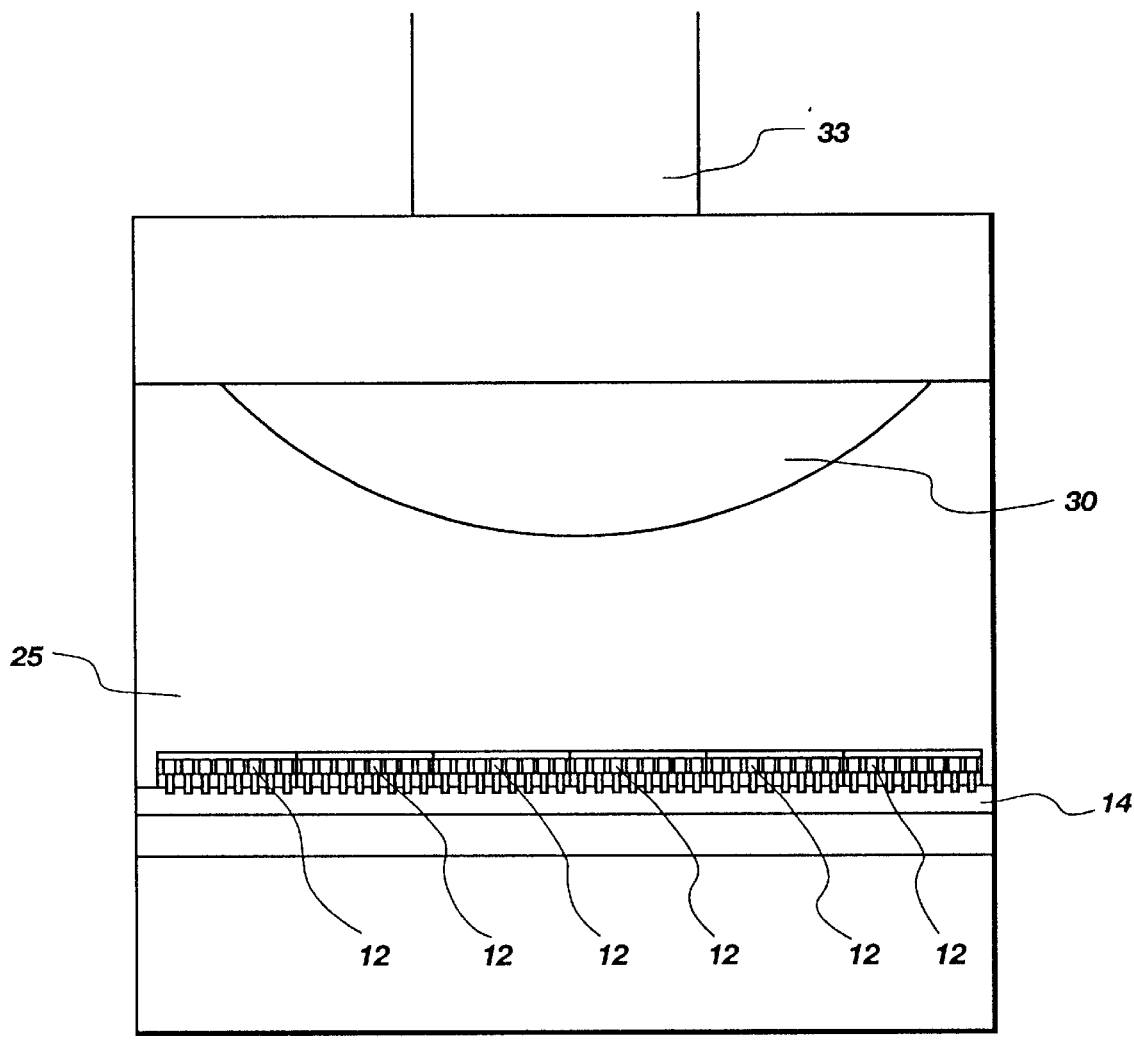
FIG. 3 is a close-up schematic side view of one embodiment of a laser marking apparatus in accordance with the present invention.

To position chips 12 at the marking field 25 (boundaries indicated by broken lines), indexing pin 24a is engaged (brought to an up position) while pin 24c is disengaged (brought to a down position) to allow chips 12 to slide down to pin 24a. With indexing pin 24d engaged, indexing pin 24a is then disengaged while substantially simultaneously indexing pin 24c is engaged to hold the remaining chips 12 upstream of pin 24c and to allow chips 12 held by pin 24a to slide to the marking field 25. The grouped chips 12 are held in place by indexing pin 24d until all of the chips 12 retained by indexing pin 24d are marked by the laser 33 (FIG. 3). Optical sensors 29 and 31 sense, respectively, whether the foremost chip in a group has reached the marking field 25 and whether a maximum number of chips 12 are present on track 14 at marking field 25 and ready to be marked by the laser 33. Once the chips 12 positioned at the marking field 25 have been marked, pin 24d is disengaged to allow chips to move downstream of pin 24d and then reengaged for the next cycle. The cycle repeats until all of the chips contained in magazine 16 have been marked.

The laser 33 may be comprised of a carbon dioxide, Nd:YAG, Nd:YLF laser or other suitable lasers or other devices, such as an electron beam emitter, known in the art. It has been determined by the inventors that a 40 watt Nd:YAG (Yttrium Aluminum Garnet) laser is preferred for optimum mark definition and clarity on plastic or ceramic surfaces. Such lasers are commercially available, as from the Laser Systems Division of General Scanning, Inc.

In the preferred embodiment shown in FIG. 3, a flat field lens 30 is positioned above the chips 12. The lens 30 is of a size sufficient to allow marking of all chips 12 positioned within the marking field 25 (for example, 6" by 6") without having to physically move the lens or translate the laser 33 from one track to the other. With such a lens, the laser power is flat or substantially equal at any point in the marking area or field. A prism or mirror, as known in the art, may be employed to direct the laser beam through the lens and to each track in turn via high speed galvanometers, as well as to move the laser beam to form the desired markings (numbers, letters, symbols, logos) on the chip surface. The laser 33, however, without the use of such a lens 30 may be laterally and longitudinally translatable so that all of the chips 12 retained by indexing pin 24d on a track 14 can be marked by the laser 33 in a single pass before laser 33 is moved over to track 15. However, such an arrangement is less preferred as being more complex and slower in operation. It may also be possible to employ an oval headed laser system wherein the laser beam is it to two sets of galvanometers. Such a system, however, is more expensive and may not be able to simultaneously mark two different types of chips 12 at adjacent marking locations since the beams function from a single set of vectors provided by the controlling microprocessor.

Figure 4:
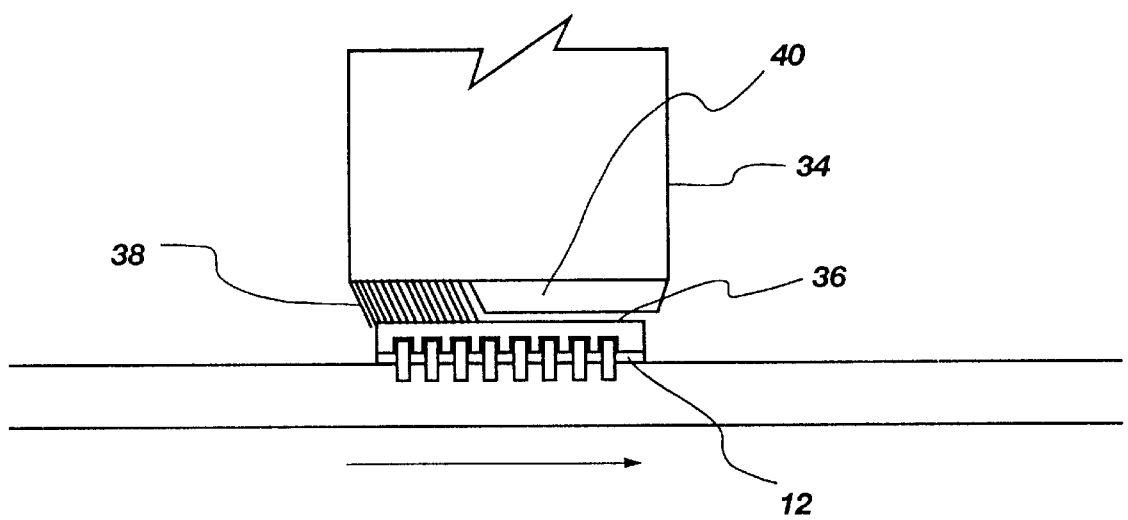
FIG. 4 is a close-up schematic side view of a packaged semiconductor passing through an embodiment of a debris removal system in accordance with the present invention.

Once the laser 33 marks the grouped chips 12 on track 14, indexing pin 24d is retracted and the chips 12 are allowed to slide until retained by indexing pin 32 at the inspection area 35. As the chips 12 pass from indexing pin 24d to indexing pin 32, they may slide under an optional debris removal system 34 as indicated by the arrow in FIG. 4. The debris removal system 34 may employ suction, forced air and/or other methods known in the art to clean minute particles from the surface 36 of the chip 12 without disturbing the markings thereon (not shown). The debris removal system 34 also carries away debris that may eventually block optical paths and thus inhibit chip 12 flow along the tracks 14. The illustration of FIG. 4 shows the debris removal system having a brush 38 and a vacuum nozzle 40. However, neither chip contact with the brush 38 nor the suction associated with the vacuum nozzle 40 are sufficient to restrict the downstream movement of a chip 12.

Another optical sensor 43 senses whether a chip 12 is present and ready for inspection. If so, the chip 12 adjacent the indexing pin 32 is then inspected by a downward-looking camera 42 which may be a CCD camera or other suitable camera known in the art. That is, the camera 42 photographs the image of the surface 36 of the chip 12 and the markings contained thereon and sends this image to a microprocessor, such as microprocessor 112. The image received by the microprocessor 112 is broken down into individual pixels and the pixels are compared to a minimum resolution standard. Once the image for a chip 12 is received and compared by the microprocessor 112, that chip 12 is released by the indexing pin 32. The adjacent, upstream chips 12 are maintained in position by the indexing pin 24*e* until each is released for inspection. If the markings on a chip 12 released by the indexing pin 32 are acceptable according to the comparison made by the microprocessor 112, then that chip 12 is allowed to slide on the track 14 to the final staging area 41. If the markings on a chip 12 are determined the microprocessor 112 to be unacceptable, a trap door 48 is opened through which that defectively-marked chip 12 drops, to be recycled for rework and remarking. An optical sensor 49 may optionally be used to verify passage of a defectively-marked chip into trap door 48. The trap door 48 preferably is hinged at the downstream side of track 14 and opens upwardly to positively prevent the poorly-marked, rejected chip 12 from erroneously continuing down the track. If desired, the image of each inspected chip 12 may be saved in memory for quality control/quality assurance purposes. It is contemplated that a vision system capable of simultaneously inspecting all chips in a marked group may be employed in lieu of the single-chip inspection currently conducted. Such a system would necessarily be more expensive due to the large field, high resolution vision requirements, but would permit chips to be staged as a group for inspection in the same manner that they are staged as a group for marking.

Output count optical sensor 51 is positioned to count the number of chips which have passed into a shipping magazine 54, so as to determine when a magazine is full and should be replaced by an empty one. Output track full optical sensor 50, located upstream of sensor 51, senses when the maximum allowable number of chips 12 is present on track 14 below trap door 48, so as to halt or slow the inspection and other operations upstream as necessary and preclude further downstream chip movement through activation of indexing pin 57. Indexing pin 52 controls chip flow into shipping magazine 54 responsive to sensor 51 (which counts the number of chips passing into each magazine) and also to sensor 53, which indicates whether or not a magazine 54 is in place for loading from final staging area 40. If no magazine is present or if sensor 51 indicates the magazine 54 aligned with track 14 is full, feed indexing foot 55 drops an empty magazine 54 into place from a stack of magazines aligned with track 14 and extending upwardly therefrom. It should be understood that the design and construction of magazines 16 and magazines 54 are preferably identical, so that unloaded feed magazines 16 may be placed at the downstream end of track 14 to act as shipping magazines 54 for transport of the acceptable, marked chips 12. Magazines 16 and 54 are preferably of an inverted "U" cross-section with a base segment to accommodate the chip package and transversely-extending legs of an appropriate width to accommodate the lead ends.

The apparatus 10 disclosed herein only requires an operator to stack tubular feed magazines 16 loaded with chips 12 to be marked and replace filled shipping magazines 54 with empty ones. The rest of the marking/inspection operation is completely automated and controlled by microprocessors. Typically, microprocessors 112 and 114 will control inspection (one for each camera), microprocessor 116 will control laser marking, and microprocessors 118 and 119 will control staging of chips 12 prior to and during marking and staging and loading of chips 12 after marking. A master control microprocessor 110 controls and coordinates the overall operation of apparatus 10 through microprocessors 112, 114, 116, 118 and 119. Chip marking on tracks 14 and 15 is thus effected simultaneously. Although six (6) microprocessors are shown in FIG. 1, more or less may be used with the same or substantially similar results. It is preferred that a parallel interface be employed between master control microprocessor 110 and laser control microprocessor 116. By way of example only, marking apparatus 10 may run with multiple control loops R. C. Jan. 15, 1996 for maximum efficiency. Overlapping of the loops gives the impression or simulation of true simultaneous multi-tasking in a more economical manner.

Figure 5:
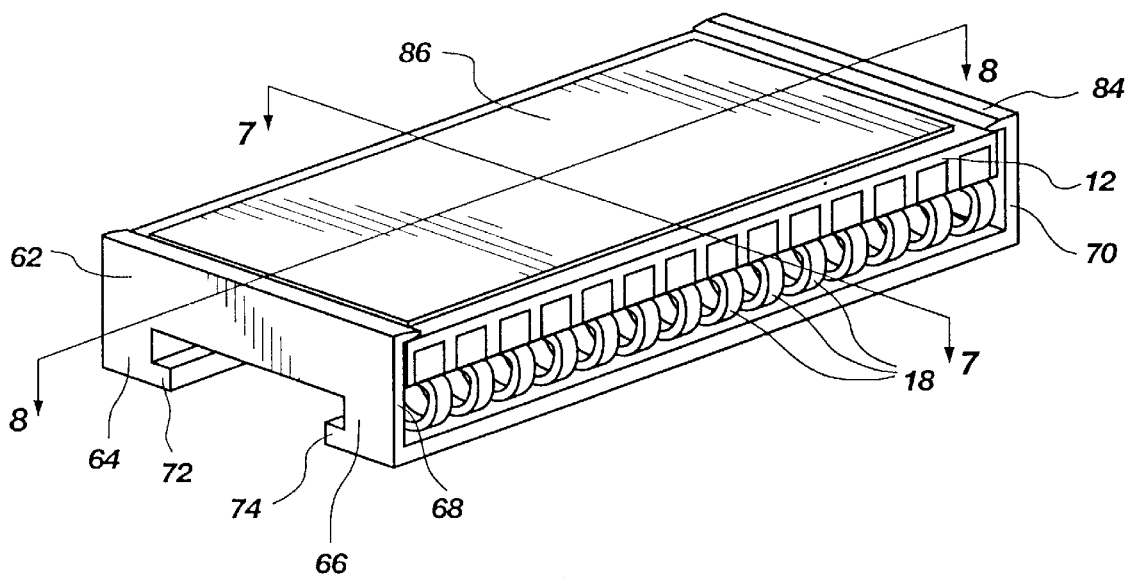
FIG. 5 is a perspective view of a packaged semiconductor contained in a chip carrier in accordance with the present invention.

It is contemplated that in certain instances, particularly as semiconductor devices become ever-smaller and employ ever-finer lead pitches, chip carriers may optionally be employed to transport packaged chips during marking and subsequent shipping. Referring now to FIG. 5, a single chip 12 is shown contained in an exemplary carrier 62. The carrier 62 is designed to engage and ride on an exemplary track 80 (FIG. 6), which would be employed in lieu of a track configured as track 14. The chips 12 are secured in carrier 62, preferably made of a statically dissipative material, such as certain plastics and other materials known in the art. It is also contemplated that the backs of bare dice or partial wafers could also be marked if provided with an appropriate carrier.

Figure 7:
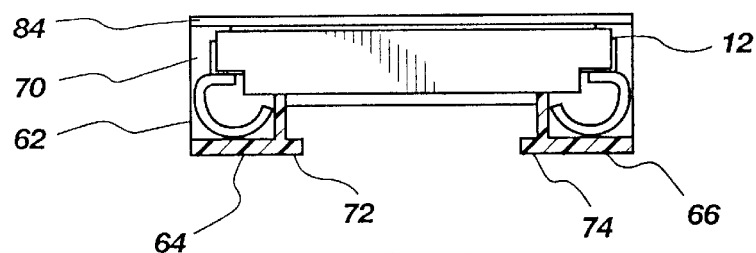
FIG. 7 is a partial section taken across lines A—A on FIG. 5.
Figure 8:
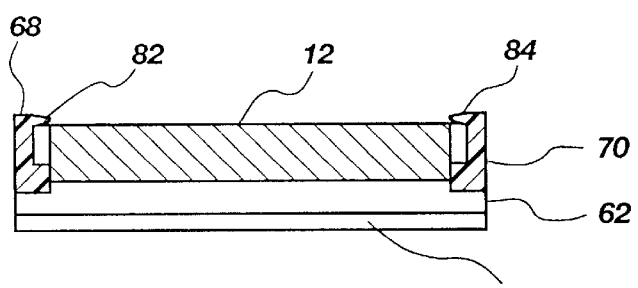
FIG. 8 is a partial section taken across lines B—B on FIG. 5.

FIGS. 7 and 8 show cross-sectional views of exemplary carrier 62. The carrier 62 has legs 64 and 66 attached to and extending between ends 68 and 70. The legs 64 and 66 also have feet 72 and 74 perpendicularly attached to the ends of legs 64 and 66, respectively for grasping the upper flanges 98 and 100 of track 80. The chip 12 is held in the carrier 62 by tabs 82 and 84, which are flexible members that allow passage of the chip 12 into the carrier and then snap over the top 86 of the chip 12. To release the chip 12, the ends 68 and 70 are pulled away from each other and the chip 12 can be easily removed from the carrier 62. Carrier 62 may also be configured in elongated form to accommodate a plurality of chips 12 to be marked, an elongated carrier using retention tabs such as 82 and 84 on partition walls longitudinally spaced along the length of the carrier. However, with this option, it becomes slightly more difficult to remove a poorly-marked chip from the production sequence, as the use of a trap door is unworkable. One manner to accommodate this function with a multi-chip carrier would be to employ a vacuum quill in combination with flanking spreader fingers descending from above to spread tabs 82 and 84 away from the chip to be discarded. For maximum efficiency, the inspection camera 42 as employed with this option would be mounted to translate along the track to inspect all of the chips 12 in one carrier 62 in a single pass. One advantage of using a multi-chip carrier would be elimination of magazines 16 and 54, the carriers 62 being stackable and functioning as the magazines.

Figure 6:
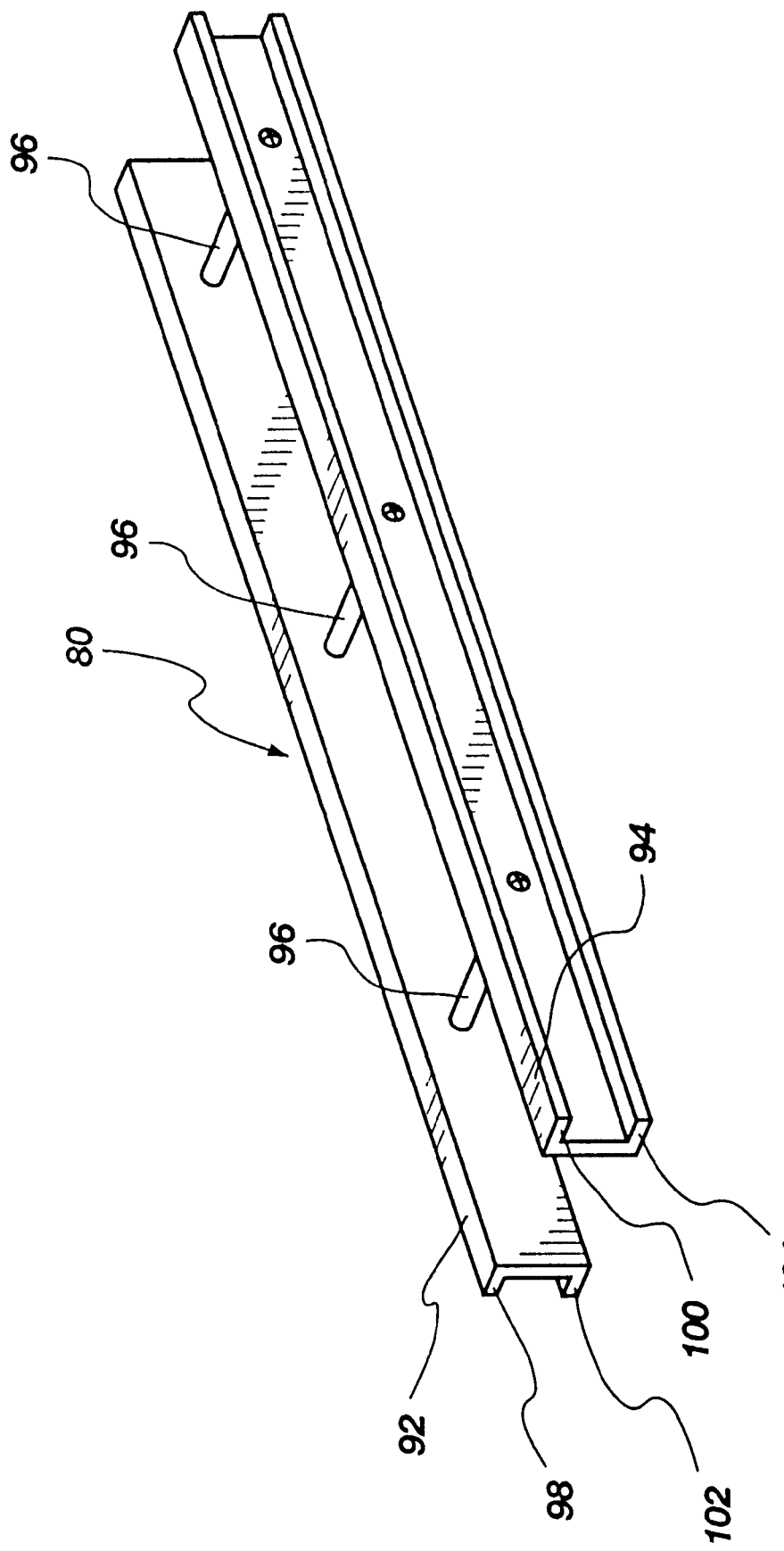
FIG. 6 is a perspective view of a portion of track in accordance with the chip carrier shown in FIG. 4.

As mentioned, the carrier 62 is adapted to slide along a track 80 shown in FIG. 6. The rails 92 and 94 of the track 80 are shown oriented back-to-back and having a "C" shaped cross-section and are spaced apart by members 96. When the carrier 62 is riding on the top of the track 80, the feet 72 and 74 grasp the top flange portions 98 and 100 of the rails 92 and 94, respectively. Due to its design, the carrier 62 may also be suspended from the bottom of the track 80 (in an inverted orientation), with the feet 72 and 74 grasping the bottom flange portions 102 and 104, respectively. Because the carrier 62 is designed to actually grasp the track 80 rather than merely ride on it, the track 80 may be placed in any vertical or horizontal orientation. This affords the possibility of feeding chips onto an absolutely vertical track 80 to maximize the speed of gravity-induced chip feed of the preferred embodiment of the invention. Further, if a vertical or extreme incline (to the horizontal) track orientation is employed, chips in carriers may be fed down both the "top" and "bottom" of the track 80 using duplicate, mirror-image sets of lasers, cameras, etc. to mark and inspect two streams of chips on both the "top" and "bottom" of the same track. The only significant modification to apparatus 10 (aside from duplication of lasers, cameras, etc.), would be the use of indexing pins or other chip positioning means operating from the sides of the track rather than extending upwardly through the bottom thereof The only significant modification to the operating routine would occur with a multi-chip carrier, wherein the inspection routine would differ and removal of defectively-marked chips would be effected in a different manner.

It should also be noted that when the chips 12 are placed in the exemplary carrier 62 and the carrier 62 is positioned on the track 80, the marking operation may occur on either the top or the bottom of the chip package. That is, both upper and lower surfaces of the chip 12 are substantially exposed, neither surface having a substantial portion covered by the carrier 62. If the chips 12 in the carrier 62 are automatically inspected, defective chips 12 may be automatically popped out of the carrier 62 by an indexing pin or the entire carrier (in the case of a single-chip carrier) dropped through a trap door 48. The defective mark can then be removed by methods known in the art and the chip 12 may then be remarked. Thus, the requirements of the process and of the marking and inspection apparatus can dictate the orientation of the track 80, the carrier 62 thereon, and the chips 12 in the carrier 62.

Figure 9B:
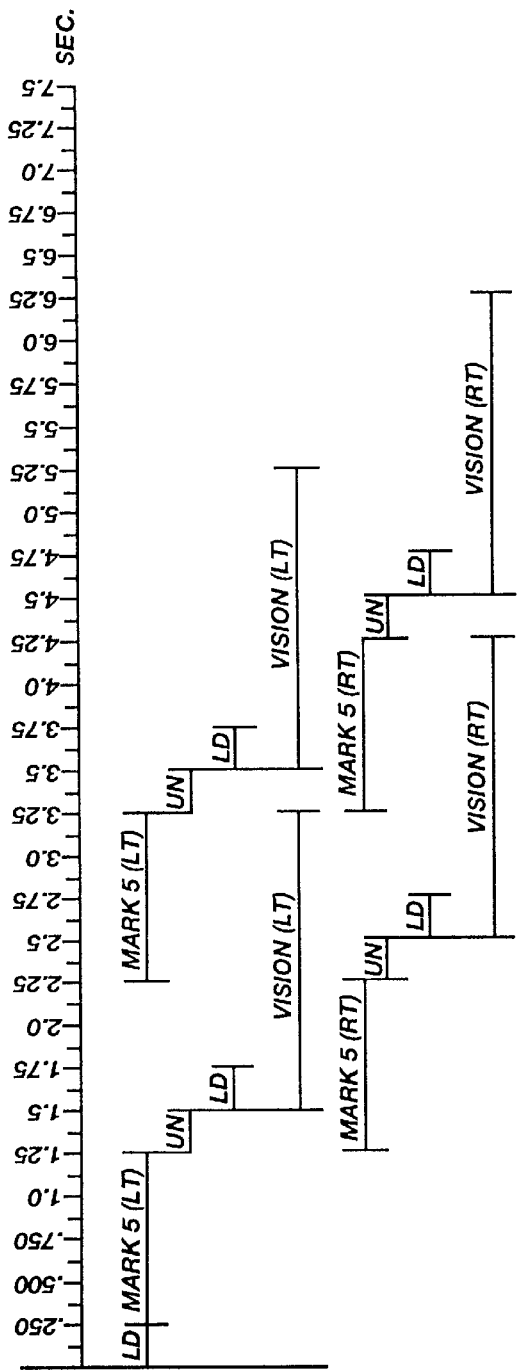
FIGS. 9A and 9B are, respectively, operational time-lines representative of the marking and inspection sequence of one- and two-track laser marking systems.
Figure 9A:
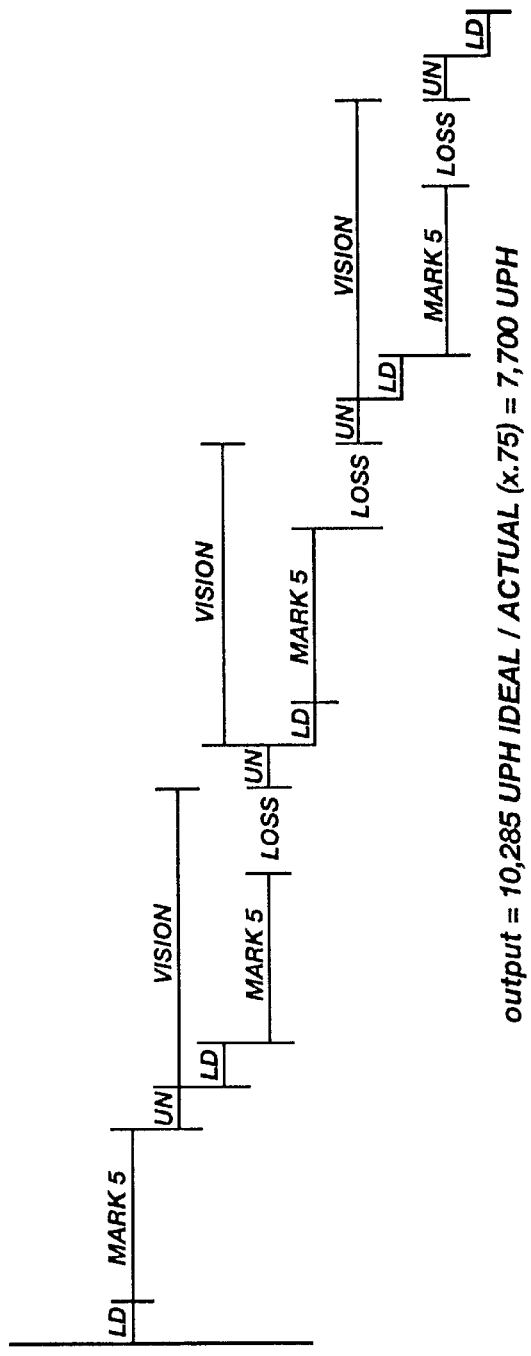

Referring now in part to FIGS. 9A and 9B of the drawings, the operation of apparatus 10 in a single-track and multi-track mode will be described so that a better appreciation of the advantages of the invention may be obtained. FIGS. 9A and 9B depict, respectively, lower and upper time-lines for chip marking, from feed or loading of chips through marking and inspection. As shown at the lower time-line (FIG. 9A), a single-track marking operation has a potential throughput of 10,285 UPH (units per hour), but in practice the throughput is limited to 7,700 UPH due to mechanical handling limitations associated with stopping and starting of the parts (chips). Acceleration and part singulation reduce theoretical throughput of the system. Lost time (LOSS) is also coincidentally experienced during the inspection (VISION) process in comparison to the marking (MARK) process. Specifically, if five (5) chips are marked (MARK 5), forwarded to VISION and then five more (MARK 5) marked on the same track, the second group of five chips will be marked before the first group of five chips is inspected. In FIGS. 9A and 9B, "LD" stands for load, and "UN" for unload, by way of complete explanation of the elements of the marking process. The horizontal axis of the time-line indicates elapsed time in seconds.

FIG. 9B depicts a two-track marking system according to the invention, employing a right-hand track (RT) and left-hand track (LT) as depicted in FIG. 1. It can be readily seen that there is no appreciable lost time (LOSS) in the two-track system of the invention. Potential output of the two-track system is 18,000 UPH, with an actual output of 13,500 UPH. Both single and double-track systems realize 75% of ideal output due to chip acceleration and singulation limitations, but the two-track system of the present invention employs a single laser 33 virtually continuously (see contiguous MARK 5's in FIG. 9B). In contrast, a single-track system requires its own dedicated laser.

By way of further explanation of apparatus 10 and its operation, FIG. 1 shows the laser path 120 as a FIG. 8, traversing one line of chips 12 on track 14 and then swinging back and across to the other track 15 to mark a second line of chips 12 being placed while the track 14 line is marked. With this manner of operation, chips are always in place for marking on one track or the other, while the alternate track is being unloaded and reloaded.

While the present invention has been described in terms of certain preferred embodiments, it is not so limited, and those of ordinary skill in the art will readily recognize and appreciate that many additions, deletions and modifications to the embodiments described herein may be made without departing from the scope of the invention as hereinafter claimed. As used in the claims, as in the preceding specification, the term "chip" or "chips" is intended to mean and encompass semiconductor devices including packaged semi-conductor dice or even bare dice or partial wafers (grouped dice). Moreover, although this invention has been described in terms of chip marking, it is contemplated that this invention may be used to mark any singulated article or object. It is further contemplated that two different types of chips may be marked at the same time, one chip type residing on a first track, and the other on a second track. Similarly, this approach may dictate (due to chip size differences) that different numbers of chips may be grouped in each track's marking location within the marking field. All that is required to effect such an operation is appropriate track configuration to accommodate each chip size and configuration, and a change in the laser program.

As alluded to above, but not specifically stated, a significant aspect of the present invention is laser-marking chips as the very last stage of the production process, after burn-in and before shipment. This approach permits marking of only burned-in and characterized chips suitable for shipment to a customer. Further, this permits marking of chips with customer-requested markings when an order is received, using an inventory of unmarked chips. The system of the present invention also facilitates custom chip fabrication and identification (marking), due to the great flexibility provided in terms of handling different chips of different sizes and configurations as different tracks. Again, marking on the last step in the fabrication process ensures only those chips which are burned-in and characterized, and of the exact quantity to be shipped, are in fact supplied to the customer.

What is claimed is:

1. A method for marking a surface of a singulated article, comprising:

positioning at least one article at a first marking location to be marked by a laser beam;

marking said at least one article at said first marking location while positioning at least a second article at a second marking location; and marking said at least a second article at said second marking location while removing said at least one marked article from said first marking location and positioning at least a third unmarked article at said first marking location.

2. The method of claim 1, wherein said singulated article is selected from the group comprising:
   a singulated packaged die, a partial wafer, or a bare singulated die.

3. The method of claim 1 further including removing said at least a second marked article from said second marking location and replacing it with at least a fourth unmarked article while said laser beam is marking at least a third article at said first marking location.

4. The method of claim 3 wherein said marking of said articles by said laser beam is alternated between said first marking location and said second marking location.

5. The method of claim 4 further including marking a group of articles positioned at one of a plurality of marking locations while replacing a group of marked articles with a like group of articles to be marked at another of a plurality of marking locations.

6. The method of claim 1 further including staging articles at a first staging location and at a second staging location before positioning said articles at said first marking location and said second marking location, respectively.

7. The method of claim 1 further including supplying articles to be marked from a supply magazine.

8. The method of claim 1 further including placing marked articles in a shipping magazine.

9. The method of claim 4 further including translating said laser beam along a linear group of articles.

10. The method of claim 1 further including removing debris from said surface of said marked article.

11. The method of claim 1 further including inspecting the quality of said marks applied to said articles.

12. The method of claim 11 further including photographing each marked article.

13. The method of claim 12 further including sending an image of each of said marked articles to a microprocessor.

14. The method of claim 13 further including comparing said images to selected marking quality control parameters.

15. The method of claim 14 further including rejecting a said article if said image of said mark thereon is not within said selected quality control parameters.

* * * * *

UNITED STATES PATENT AND TRADEMARK OFFICE
CERTIFICATE OF CORRECTION

PATENT NO : 5,937,270
DATED : August 10, 1999
INVENTOR(S) : Canella

It is certified that error appears in the above-identified patent and that said Letters Patent is hereby corrected as shown below:

On the title page, under [56] References Cited, FOREIGN PATENT DOCUMENTS, insert:

| | | |
|---|---|---|
| 1-100677 | 4/1989 | Japan |
| 57-53955 | 3/1982 | Japan |
| 0 653 791 | 5/1995 | EPO |
| 243 798 | 3/1987 | East Germany |

In column 5, lines 61-62, delete "feed control 17" and insert --feed indexing foot 17--;
In column 6, line 45, after "is", delete "it" and insert --split--;
In column 7, line 51, delete "40" and insert --41--;
In column 8, line 17, after "control loops", delete "R.C. Jan.15, 1996";
In column 8, line 40, after "track 80", insert --(FIG. 6)--;
In column 10, line 51, delete "on", and insert --as--;
In claim 11, column 12, line 10, before "marks", delete "said"; and
In claim 15, column 12, line 18, delete "said" and insert --marked--. (1st occurr.)

Signed and Sealed this

Seventh Day of March, 2000

Attest:

Attesting Officer

Q. TODD DICKINSON

Commissioner of Patents and Trademarks